(12) United States Patent
Wan et al.

(10) Patent No.: US 12,376,449 B2
(45) Date of Patent: Jul. 29, 2025

(54) OLED DISPLAY PANEL

(71) Applicant: Shenzhen China Star Optoelectronics Semiconductor Display Technology Co., Ltd., Guangdong (CN)

(72) Inventors: Zhijun Wan, Guangdong (CN); Jinchuan Li, Guangdong (CN); Weiran Cao, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 467 days.

(21) Appl. No.: 17/974,639

(22) Filed: Oct. 27, 2022

(65) Prior Publication Data

US 2024/0114711 A1 Apr. 4, 2024

(30) Foreign Application Priority Data

Sep. 29, 2022 (CN) .......................... 202211203898.3

(51) Int. Cl.
*H10K 50/16* (2023.01)
*H10K 50/17* (2023.01)
*H10K 50/824* (2023.01)
*H10K 102/00* (2023.01)

(52) U.S. Cl.
CPC .......... *H10K 50/16* (2023.02); *H10K 50/171* (2023.02); *H10K 2102/00* (2023.02)

(58) Field of Classification Search
CPC .... H10K 50/16; H10K 50/171; H10K 50/824; H10K 2102/00
See application file for complete search history.

(56) References Cited

U.S. PATENT DOCUMENTS

| | | | |
|---|---|---|---|
| 2016/0093680 A1* | 3/2016 | Paek .................... | H10K 50/805 438/34 |
| 2019/0115561 A1* | 4/2019 | Tang ................... | H10K 59/1213 |
| 2020/0303478 A1* | 9/2020 | Lee ..................... | H10K 59/1216 |
| 2020/0343315 A1* | 10/2020 | Lin ...................... | H10K 50/824 |
| 2021/0151712 A1* | 5/2021 | Lee ..................... | H10K 59/122 |
| 2023/0110744 A1* | 4/2023 | Kim ..................... | H10K 59/122 257/107 |

* cited by examiner

*Primary Examiner* — Omar F Mojaddedi (57) ABSTRACT

An OLED display panel comprises an overlapping area, and further includes a driving circuit layer, a light-emitting functional layer, a cathode layer, and a conductive layer. In the overlapping area, a terminal of the driving circuit layer, a first conductive layer and a second conductive layer of the conductive layer, an electron transport layer and an electron injection layer of the light-emitting functional layer, and the cathode layer are disposed sequentially from bottom to top. The first conductive layer includes a plurality of protrusions. Each of the electron transport layer and the electron injection layer is disconnected at the protrusions, and the cathode layer is in contact with the protrusions.

13 Claims, 7 Drawing Sheets

OLED DISPLAY PANEL

RELATED APPLICATION

This application claims the benefit of priority of Chinese Patent Application No. 202211203898.3 filed on Sep. 29, 2022, the contents of which are incorporated by reference as if fully set forth herein in their entirety.

FIELD AND BACKGROUND OF THE INVENTION

The present disclosure relates to the technical field of display, and particularly to an OLED display panel.

With the development of display technology, in order to reduce cost, a hole injection layer, a hole transport layer, and a light emitting layer of an organic light-emitting diode (OLED) display device are formed by inkjet printing. Due to material limitations of an electron transport layer and an electron injection layer, the electron transport layer and the electron injection layer needs to be formed by vapour deposition. A cathode electrode is also formed by vapour deposition. Because the cathode electrode needs to be overlapped and conducted with a metal wire when it is formed, it is necessary to make an area of the cathode electrode greater than an area of the electron injection layer and an area of the electron transport layer. Therefore, at least two masks are required, which are designed with multiple cavities to form the cathode electrode and the electron injection/transport layer with different areas. This results in low production efficiency of the OLED display device.

Therefore, a current OLED display device has a technical problem of low production efficiency of the OLED display device due to different masks of a cathode electrode and an electron injection/transport layer.

SUMMARY OF THE INVENTION

The present disclosure provides an OLED display panel to solve a technical problem of low production efficiency of a current OLED display device caused by different masks of a cathode electrode and an electron injection/transport layer in the current OLED display device.

The present disclosure provides an OLED display panel comprising a display area and an overlapping area. The OLED display panel further comprises a substrate, a driving circuit layer, a light-emitting functional layer, a cathode layer, and a conductive layer. The driving circuit layer is disposed on a side of the substrate and comprises a terminal. The light-emitting functional layer is disposed on a side of the driving circuit layer away from the substrate, and comprises an electron transport layer and an electron injection layer. The electron transport layer is disposed between the driving circuit layer and the electron injection layer. The cathode layer is disposed on a side of the electron injection layer away from the electron transport layer. The conductive layer is disposed in the overlapping area, and comprises a first conductive layer and a second conductive layer. The first conductive layer is disposed between the terminal and the second conductive layer and comprises a plurality of protrusions. The second conductive layer is disposed between the first conductive layer and the electron transport layer. The electron injection layer is disposed between the electron transport layer and the cathode layer. Each of the electron transport layer and the electron injection layer is disconnected at the protrusions, and the cathode layer is in contact with the protrusions.

In some embodiments, a metal mobility of the first conductive layer is greater than a metal mobility of the second conductive layer, and an oxidation rate of the first conductive layer is greater than an oxidation rate of the second conductive layer.

In some embodiments, the first conductive layer is made of a first metal material. A metal mobility of the first metal material is greater than the metal mobility of the second conductive layer, and an oxidation rate of the first metal material is greater than the oxidation rate of the second conductive layer.

In some embodiments, the second conductive layer is made of a second metal material or metal oxide.

In some embodiments, the protrusions comprise a first protrusion located on a side surface of the first conductive layer. The electron injection layer and the electron transport layer are located on a side of the first protrusion, and the cathode layer is in contact with at least a top of the first protrusion.

In some embodiments, a projection of a surface of the second conductive layer in contact with the first conductive layer on the substrate coincides with a projection of a surface of the first conductive layer in contact with the second conductive layer on the substrate.

In some embodiments, a projection of a surface of the second conductive layer in contact with the first conductive layer on the substrate is less than a projection of a surface of the first conductive layer in contact with the second conductive layer on the substrate.

In some embodiments, the protrusions further comprise a second protrusion located on a region of the surface of the first conductive layer outside the second conductive layer. The electron injection layer and the electron transport layer are located on a side of the second protrusion, and the cathode layer is in contact with at least a top of the second protrusion.

In some embodiments, the OLED display panel further comprises a pixel electrode layer. The pixel electrode layer comprises a pixel electrode located in the display area, and the first conductive layer and the second conductive layer located in the overlapping area.

In some embodiments, the conductive layer comprises two or more conductive units. The conductive units are arranged at intervals. The protrusions on each of the conductive units are spaced apart from adjacent conductive units.

In some embodiments, each of the conductive units comprises a conductive portion and a via hole. The conductive portion is arranged around the via hole. In each of the conductive units, the protrusions are formed on a surface of the conductive portion close to the via hole.

In some embodiments, each of the conductive units further comprises a connection portion corresponding to the via hole and connected to the conductive portion.

In some embodiments, the conductive layer further comprises a third conductive layer disposed between the first conductive layer and the terminal. A conductivity of the third conductive layer is greater than a conductivity of the first conductive layer, a metal mobility of the third conductive layer is less than a metal mobility of the first conductive layer, and an oxidation rate of the third conductive layer is less than an oxidation rate of the first conductive layer.

The present disclosure provides an OLED display panel. The OLED display panel comprises a display area and an overlapping area, and further comprises a substrate, a driving circuit layer, a light-emitting functional layer, a cathode layer, and a conductive layer. The driving circuit layer is disposed on a side of the substrate and comprises a terminal. The light-emitting functional layer is disposed on a side of the driving circuit layer away from the substrate, and comprises an electron transport layer and an electron injection layer. The electron transport layer is disposed between the driving circuit layer and the electron injection layer. The cathode layer is disposed on a side of the electron injection layer away from the electron transport layer. The conductive layer is disposed in the overlapping area, and comprises a first conductive layer and a second conductive layer. The first conductive layer is disposed between the terminal and the second conductive layer and comprises a plurality of protrusions. The second conductive layer is disposed between the first conductive layer and the electron transport layer. The electron injection layer is disposed between the electron transport layer and the cathode layer. Each of the electron transport layer and the electron injection layer is disconnected at the protrusions, and the cathode layer is in contact with the protrusions. In the present disclosure, the first conductive layer and the second conductive layer are disposed in the overlapping area, the first conductive layer is disposed between the terminal and the second conductive layer, the second conductive layer is disposed between the first conductive layer and the electron transport layer, and the electron injection layer is disposed between the electron transport layer and the cathode layer, so that the electron injection layer, the electron transport layer, and the cathode layer can be formed with one mask, so as to improve production efficiency of the OLED display panel. Furthermore, the first conductive layer is provided with the protrusions, so that Each of the electron transport layer and the electron injection layer is disconnected at the protrusions, and the cathode layer is in contact with the protrusions. Therefore, the cathode layer is connected to the terminal only by the conductive layer, so as to improve conduction between the cathode layer and the terminal, so that the OLED display panel can work normally.

BRIEF DESCRIPTION OF THE SEVERAL VIEWS OF THE DRAWINGS

Specific implementations of the present disclosure will be described in detail below in conjunction with accompanying drawings to make technical solutions and beneficial effects of the present disclosure obvious.

DESCRIPTION OF SPECIFIC EMBODIMENTS OF THE INVENTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

The present disclosure provides an OLED display panel to solve a technical problem of low production efficiency of a current OLED display device caused by different masks of a cathode electrode and an electron injection/transport layer in the current OLED display device.

Figure 1:
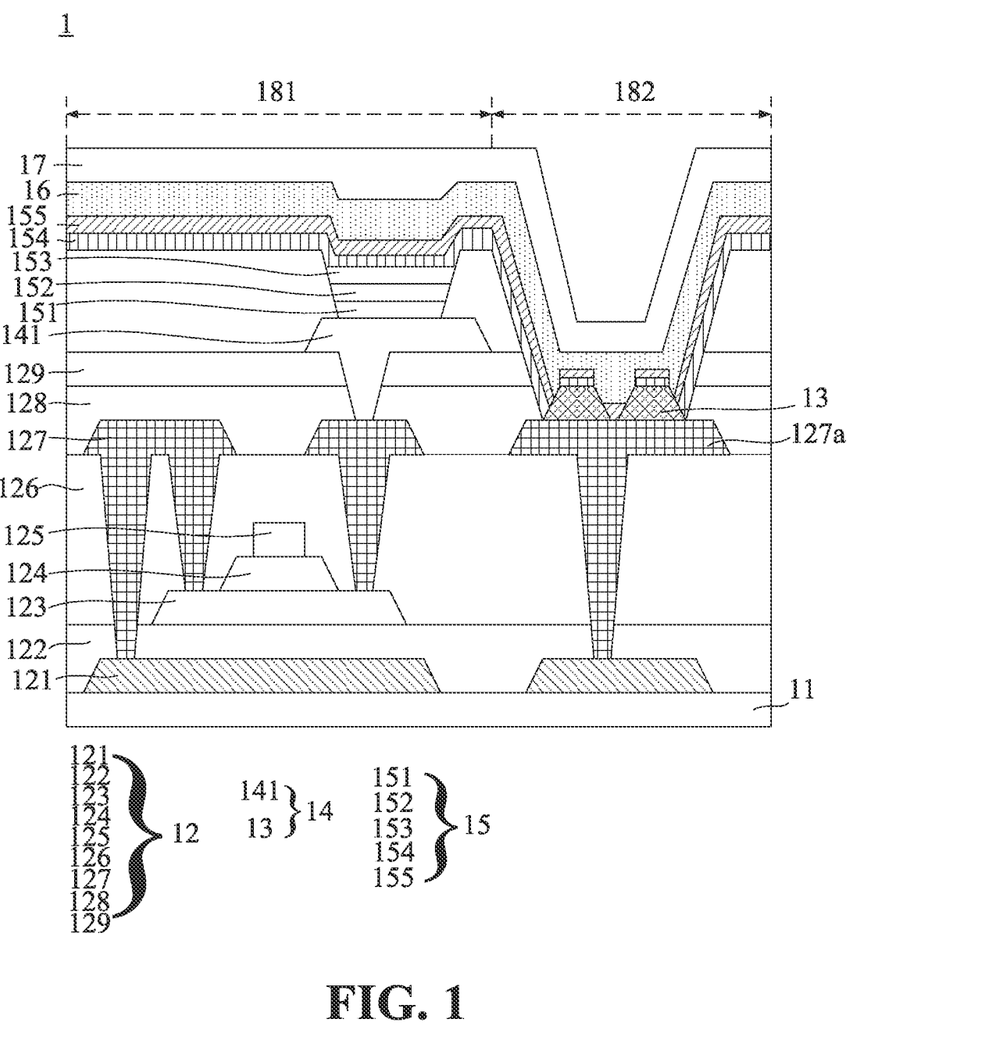
FIG. 1 is a first schematic diagram of an OLED display panel according to an embodiment of the present disclosure.
Figure 2:
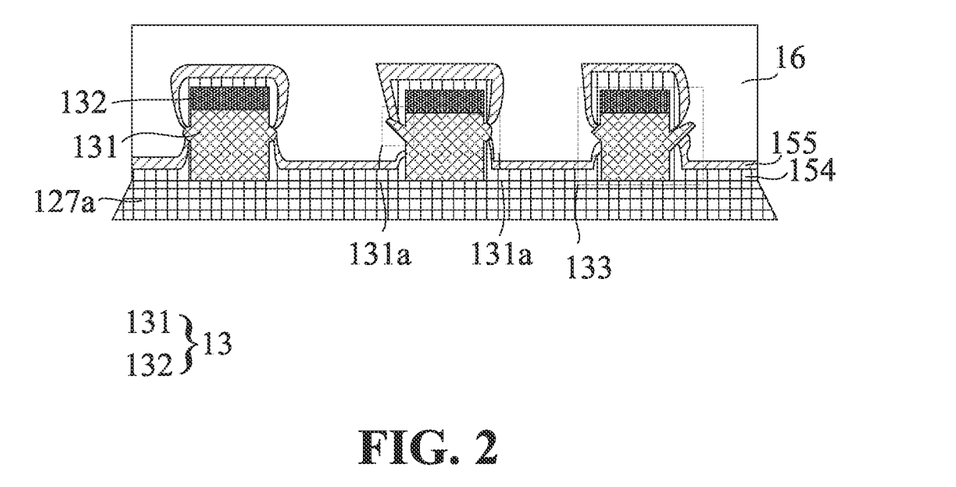
FIG. 2 is a second schematic diagram of an OLED display panel according to an embodiment of the present disclosure.

As shown in FIG. 1 and FIG. 2, the present disclosure provides an OLED display panel 1, which comprises a display area 181 and an overlapping area 182, and further comprises a substrate 11, a driving circuit layer 12, a light-emitting functional layer 15, a cathode layer 16, and a conductive layer 13. The driving circuit layer 12 is disposed on a side of the substrate 11 and comprises a terminal 127a. The light-emitting functional layer 15 is disposed on a side of the driving circuit layer 12 away from the substrate 11, and comprises an electron transport layer 154 and an electron injection layer 155. The electron transport layer 154 is disposed between the driving circuit layer 12 and the electron injection layer 155. The cathode layer 16 is disposed on a side of the electron injection layer 155 away from the electron transport layer 154. The conductive layer 13 is disposed in the overlapping area 182, and comprises a first conductive layer 131 and a second conductive layer 132. The first conductive layer 131 is disposed between the terminal 127a and the second conductive layer 132 and comprises a plurality of protrusions 131a. The second conductive layer 132 is disposed between the first conductive layer 131 and the electron transport layer 154. The electron injection layer 155 is disposed between the electron transport layer 154 and the cathode layer 16. Each of the electron transport layer 154 and the electron injection layer 155 are disconnected at the protrusions 131a, and the cathode layer 16 is in contact with the protrusions 131a.

The present disclosure provides an OLED display panel. The OLED display panel comprises a first conductive layer and a second conductive layer. In an overlapping area, the first conductive layer is disposed between a terminal and the second conductive layer, the second conductive layer is disposed between the first conductive layer and an electron transport layer, and an electron injection layer is disposed between the electron transport layer and a cathode layer, so that the electron injection layer, the electron transport layer, and the cathode layer can be formed with one mask, so as to improve production efficiency of the OLED display panel. Furthermore, the first conductive layer is provided with protrusions, so that Each of the electron transport layer and the electron injection layer is disconnected at the protrusions, and the cathode layer is in contact with the protrusions. Therefore, the cathode layer is connected to the terminal only by the conductive layer, so as to improve conduction between the cathode layer and the terminal, so that the OLED display panel can work normally.

In an embodiment, a metal mobility of the first conductive layer is greater than a metal mobility of the second conductive layer, and an oxidation rate of the first conductive layer is greater than an oxidation rate of the second conductive layer. By making the metal mobility of the first conductive layer greater than the metal mobility of the second conductive layer, and making the oxidation rate of the first conductive layer greater than the oxidation rate of the second conductive layer, the first conductive layer can automatically form the protrusions through metal migration and/or oxidation. Then, Each of the electron transport layer and the electron injection layer is disconnected at the protrusions, so that the cathode layer is in contact with the protrusions. Therefore, the cathode layer is connected to the terminal only by the conductive layer, so as to improve the conduction between the cathode layer and the terminal, so that the OLED display panel can work normally.

It should be noted that the metal mobility of the first conductive layer is greater than the metal mobility of the second conductive layer, and the oxidation rate of the first conductive layer is greater than the oxidation rate of the second conductive layer, which means that stability of the first conductive layer is less than stability of the second conductive layer. That is, during a preparation process of the first conductive layer and the second conductive layer, the first conductive layer is more prone to metal migration, and thus dendritic protrusions or fibrous protrusions are formed from the first conductive layer. Furthermore, the first conductive layer is more prone to oxidation, and thus swelling protrusions are formed from the first conductive layer. In the present disclosure, the protrusions comprise the aforementioned dendritic protrusions, fibrous protrusions, and swelling protrusions, but are not limited thereto. Parts protruding from the first conductive layer belong to the protrusions described in the present disclosure. The second conductive layer is not prone to metal migration and oxidation, so the second conductive layer has a better effect of conducting the cathode layer and the first conductive layer. Furthermore, the second conductive layer can protect the first conductive layer to prevent the first conductive layer from being completely oxidized and/or having poor conductivity after metal migration, so that the conductive layer can better conduct the cathode layer and the terminal.

It should be noted that when metal migration and/or oxidation occurs in the first conductive layer, the protrusions of the first conductive layer are not completely oxidized, but a structure of the first conductive layer becomes loose. An entirety of the first conductive layer is a mixture of metal and metal oxide, and is conductive. Therefore, when the cathode layer is in contact with the protrusions, they can be conducted.

Specifically, as shown in FIG. 1, the electron transport layer 154, the electron injection layer 155, and the cathode layer 16 are all disposed in the display area 181 and the overlapping area 182. Therefore, when manufacturing the OLED display panel, the electron transport layer, the electron injection layer, and the cathode layer may be formed by one same metal mask, so as to improve the production efficiency of the OLED display panel and reduce cost. However, for a current display device, when an electron transport layer and an electron injection layer are disposed in an overlapping area, the electron transport layer and the electron injection layer are disposed between a cathode layer and a terminal. Poor conductivities of the electron transport layer and the electron injection layer may lead to poor conduction between the cathode layer and the terminal (for example, excessive impedance leads to insufficient voltage, so that the cathode layer and the terminal are intermittently disconnected and conducted), or even failure to conduct the cathode layer and the terminal. Therefore, the current display device needs two different masks, one mask for forming the electron transport layer and the electron injection layer, and the other mask for forming the cathode layer, so that the electron transport layer and the electron injection layer are not disposed in the overlapping area. This leads to lower production efficiency and higher cost of the current display device. That is, the current display device cannot take into account conduction between the cathode layer and the terminal and the production efficiency.

Specifically, as shown in FIG. 1 and FIG. 2, in the present disclosure, the conductive layer 13 is disposed between the electron transport layer 154 and the terminal 127a, the metal mobility of the first conductive layer 131 is greater than the metal mobility of the second conductive layer 132, and the oxidation rate of the first conductive layer 131 is greater than the oxidation rate of the second conductive layer 132. Therefore, when the first conductive layer and the second conductive layer are formed, the first conductive layer can automatically form the protrusions. Each of the electron transport layer and the electron injection layer is disconnected by the protrusions, so that the cathode layer is in contact with the protrusions, and the cathode layer is connected to the terminal only by the conductive layer. This prevents that the cathode layer and the terminal are not conducted due to the electron transport layer and the electron injection layer. Furthermore, the conductive layer reduces an impedance of the terminal and the cathode layer, thereby improving the conduction between the cathode layer and the terminal. Accordingly, the conduction between the cathode layer and the terminal and the production efficiency are taken into account.

Specifically, compared with a technical solution of using an undercut structure to disconnect the electron transport layer and the electron injection layer, the present disclosure adopts the first conductive layer and the second conductive layer with specific structure and material design, so that the first conductive layer can automatically form protrusions during a preparation process without any additional process. This reduces process steps, avoids affecting performance of thin film transistors, and improves the performance of the thin film transistors.

Specifically, it can be seen from FIG. 2 that the protrusions 131a comprise various forms. The specific shapes of the protrusions 131a are not limited in the present disclosure, and are based on shapes of the protrusions formed in an actual manufacturing process. Any structure protruding from the first conductive layer belongs to the protrusions in the present disclosure, which will not be described in detail herein.

In an embodiment, the first conductive layer is made of a first metal material. A metal mobility of the first metal material is greater than the metal mobility of the second conductive layer, and an oxidation rate of the first metal material is greater than the oxidation rate of the second conductive layer. By making the first conductive layer made of the first metal material, metal migration and/or oxidation will occur in the first conductive layer during the preparation process, thereby producing protrusions of a mixture of metal oxide and metal. The electron transport layer and the electron injection layer are disconnected by the protrusions, so that the cathode layer is connected to the terminal only by the conductive layer, so as to realize normal conduction between the cathode layer and the terminal. Furthermore, the first conductive layer is protected by the second conductive layer to avoid complete oxidation of the first conductive layer.

Specifically, the first metal material is silver, copper, or aluminum.

The first conductive layer is made of the first metal material, so during the preparation process, the first conductive layer undergoes metal migration and/or oxidation to form protrusions. The protrusions disconnect the electron transport layer and the electron injection layer, and connect the cathode layer.

In an embodiment, the second conductive layer is made of a second metal material or metal oxide, so that the second conductive layer has better conductivity, protects the first conductive layer, and improves the conduction between the cathode layer and the terminal.

Specifically, the second metal material is molybdenum or titanium, and the metal oxide is indium tin oxide or indium zinc oxide. The second conductive layer is made of the second metal material or metal oxide, so that during the preparation process, the second conductive layer protects the first conductive layer and prevents the first conductive layer from being completely oxidized. Furthermore, the second conductive layer improves the conductivity of the first conductive layer, so that a conduction effect between the cathode layer and the terminal is better.

Figure 3:
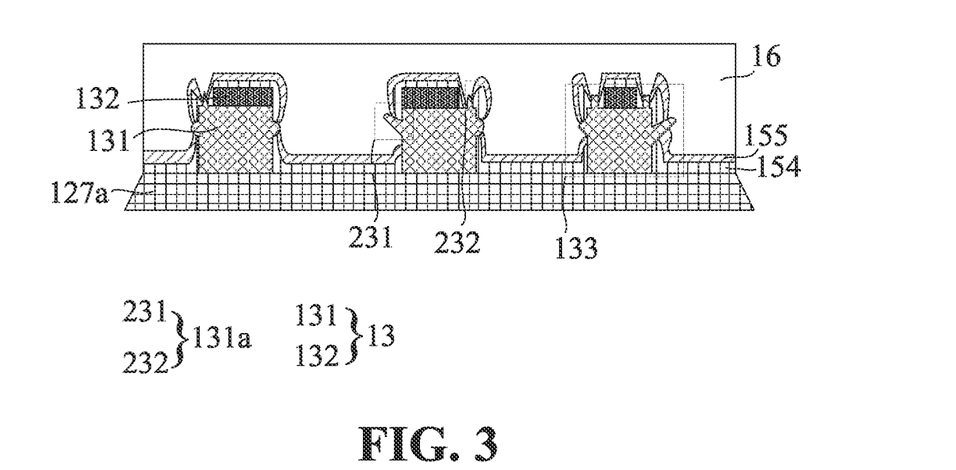
FIG. 3 is a third schematic diagram of an OLED display panel according to an embodiment of the present disclosure.

In an embodiment, as shown in FIG. 3, the protrusions 131a comprise a first protrusion 231 located on a side surface of the first conductive layer 131. The electron injection layer 154 and the electron transport layer 155 are located on a side of the first protrusion 231, and the cathode layer 16 is in contact with at least a top of the first protrusion 231. By forming the first protrusion on the side of the first conductive layer, the electron transport layer and the electron injection layer are broken at the first protrusion, so that when the cathode layer is subsequently formed, the cathode layer is in contact with the first protrusion. The cathode layer is electrically connected to the first conductive layer and the second conductive layer through the first protrusion, and is electrically connected to the terminal through the conductive layer. This realizes electrical connection between the cathode layer and the terminal, and takes into account the conduction between the cathode layer and the terminal and the production efficiency.

Specifically, as shown in FIG. 3, the first protrusion 231 is located on the side surface of the first conductive layer 131. During formation of the electron transport layer and the electron injection layer, due to an influence of gravity, when the first protrusion exists, the electron transport layer and the electron injection layer are more prone to breakage on the side surface of the first conductive layer. Therefore, the first protrusion disconnects the electron transport layer and the electron injection layer, and the cathode layer is in contact with the top of the first protrusion. This realizes electrical connection between the cathode layer and the conductive layer, thereby realizing the electrical connection between the cathode layer and the terminal.

Specifically, the first protrusion may be arranged around the first conductive layer. By arranging the first protrusion around the first conductive layer, a possibility of cracking of the electron transport layer and the electron injection layer is increased, and a contact area between the cathode layer and the first conductive layer is increased. For example, the cathode layer is in contact with the side of the first conductive layer, which improves the conduction between the cathode layer and the first conductive layer.

The first conductive layer is prone to metal migration and oxidation, which may lead to a problem of inability to conduct the terminal and the cathode layer. In an embodiment, as shown in FIG. 2, a projection of a surface of the second conductive layer 132 in contact with the first conductive layer 131 on the substrate 11 coincides with a projection of a surface of the first conductive layer 131 in contact with the second conductive layer 132 on the substrate 11. By making the projection of the surface of the second conductive layer in contact with the first conductive layer on the substrate coincide with the projection of the surface of the first conductive layer in contact with the first conductive layer on the substrate, the second conductive layer can protect an upper surface of the first conductive layer. This avoids that because the first conductive layer is completely oxidized, the conductivity of the first conductive layer becomes poor, and the cathode layer and the terminal are not conducted. Furthermore, the second conductive layer is connected to the first conductive layer, which improves a conductivity of the conductive layer and reduces a resistance between the cathode layer and the terminal.

Specifically, as shown in FIG. 2, due to the protrusions 131a, different portions of the first conductive layer 131 have different widths. Furthermore, different portions of the second conductive layer 132 shown in FIG. 2 have same widths. However, in an actual design, due to process limitations, the second conductive layer is shaped as a trapezoid. Therefore, when the second conductive layer is used to protect the first conductive layer, a width of the surface of the second conductive layer in contact with the first conductive layer is equal to a width of the surface of the first conductive layer in contact with the second conductive layer, which prevents a top surface of the first conductive layer from being oxidized, resulting in poor conductivity of the first conductive layer.

In an embodiment, as shown in FIG. 3, a projection of a surface of the second conductive layer 132 in contact with the first conductive layer 131 on the substrate 11 is less than a projection of a surface of the first conductive layer 131 in contact with the second conductive layer 132 on the substrate 11. By making the width of the surface of the second conductive layer in contact with the first conductive layer less than the width of the surface of the first conductive layer in contact with the second conductive layer, an exposed area of the first conductive layer increases. Therefore, more protrusions can be formed to break more parts of the electron transport layer and the electron injection layer, thereby improving the electrical connection between the cathode layer and the first conductive layer.

For a problem that fewer protrusions of the first conductive layer lead to fewer broken parts of the electron transport layer and the electron injection layer and poor conduction between the cathode layer and the first conductive layer, in an embodiment, as shown in FIG. 3, the protrusions 131a further comprise a second protrusion 232 located on a region of the surface of the first conductive layer 131 outside the second conductive layer 132, and the electron injection layer 154 and the electron transport layer 155 are located on a side of the second protrusion 232, and the cathode layer 16 is in contact with at least a top of the second protrusion 232. By making the width of the surface of the first conductive layer in contact with the second conductive layer greater than the width of the surface of the second conductive layer in contact with the first conductive layer, a part of the upper surface of the first conductive layer is also exposed, so that the second protrusion can be formed on the upper surface of the first conductive layer. The electron transport layer and the electron injection layer are broken at the second protrusion, and the electron transport layer and the electron injection layer are arranged on both sides of the second protrusion, so that the cathode layer can be in contact with the top of the second protrusion, thereby increasing the number of places where the cathode layer is in contact with the first conductive layer, improving conduction between the cathode layer and the conductive layer, and improving the conduction between the cathode layer and the terminal.

Specifically, as shown in FIG. 3, in the region of the surface of the first conductive layer 131 outside the second conductive layer 132, the first conductive layer 131 is formed with the second protrusion 232. The electron transport layer 154 and the electron injection layer 155 are broken at the second protrusion 232. During the formation of the electron transport layer 154 and the electron injection layer 155, the electron transport layer 154 and the electron injection layer 155 are pierced by the second protrusion 232, so that the first conductive layer 131 is connected to the cathode layer 16 through the second protrusion 232, thereby increasing the number of places where the cathode layer 16 is in contact with the first conductive layer 131, improving conduction between the cathode layer 16 and the conductive layer 13, and improving the conduction between the cathode layer 16 and the terminal 127a.

The above embodiments are described in detail by taking the example that the protrusions are located on the side surface of the first conductive layer, or the protrusions comprise a first protrusion located on the side surface of the first conductive layer and a second protrusion located on the top surface of the first conductive layer, but the present disclosure is not limited thereto. For example, the second conductive layer may wrap the side surface of the first conductive layer, so that the upper surface of the first conductive layer is exposed. Therefore, the protrusions are located on the upper surface of the first conductive layer, disconnect the electron transport layer and the electron injection layer, and connect the first conductive layer and the cathode layer.

For problems that formation of the first conductive layer and the second conductive layer during a manufacturing process of the OLED display panel will lead to lower production efficiency and increased thickness of the OLED display panel, in an embodiment, as shown in FIG. 1 and FIG. 2, the OLED display panel 1 further comprises a pixel electrode layer 14. The pixel electrode layer 14 comprises a pixel electrode 141 located in the display area 181, and the first conductive layer 131 and the second conductive layer 132 located in the overlapping area 182. By making the pixel electrode layer comprise the pixel electrode, the first conductive layer, and the second conductive layer, when the pixel electrode is formed, the first conductive layer and the second conductive layer can be formed at the same time. This avoids increasing a thickness of the OLED display panel, reduces process steps of the OLED display panel, and improves the production efficiency of the OLED display panel.

Specifically, when setting the pixel electrode layer, the pixel electrode layer may be designed to comprise a first pixel electrode layer close to a source and drain layer and a second pixel electrode layer close to the cathode layer. A metal mobility of the first pixel electrode layer is greater than a metal mobility of the second pixel electrode layer, and an oxidation rate of the first pixel electrode layer is greater than an oxidation rate of the second pixel electrode layer. The first conductive layer is formed by the first pixel electrode layer, and the second conductive layer is formed by the second pixel electrode layer, so as to avoid increasing the thickness of the OLED display panel, reduce the process steps of the OLED display panel, and improve the production efficiency of the OLED display panel.

Specifically, for example, the first pixel electrode layer is made of silver, and the second pixel electrode layer is made of indium tin oxide. Then, the first pixel electrode layer may be used to form the first conductive layer, and the second pixel electrode layer may be used to form the second conductive layer, so that the first conductive layer can form protrusions, which disconnect the electron transport layer and the electron injection layer, connect the cathode layer, and realize the conduction between the cathode layer and the terminal.

In an embodiment, as shown in FIG. 2, the conductive layer 13 comprises two or more conductive units 133. The conductive units 133 are arranged at intervals. The protrusions 131a on each of the conductive units 133 are spaced apart from adjacent conductive units 133. The conductive layer is formed into a plurality of conductive units, and each of the conductive units is formed with protrusions, so as to increase the number of protrusions. As a result, the electron transport layer and the electron injection layer are broken at many positions, and the number of places where the cathode layer is in contact with the first conductive layer is increased. Therefore, the conduction between the cathode layer and the conductive layer is improved, thereby improving the conduction between the cathode layer and the terminal.

Specifically, in order to prevent adjacent conductive units from affecting each other, it is necessary to have a certain distance between adjacent conductive units. Therefore, adjacent conductive units may be spaced apart by 10 microns.

Figure 4:
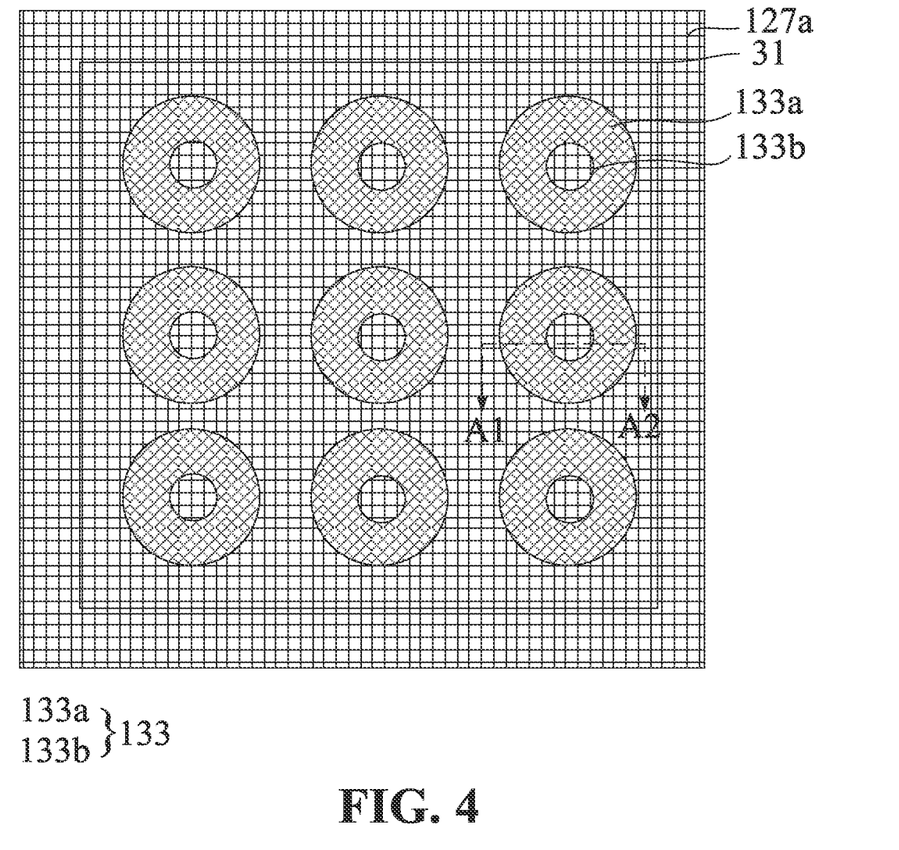
FIG. 4 is a fourth schematic diagram of an OLED display panel according to an embodiment of the present disclosure.
Figure 5:
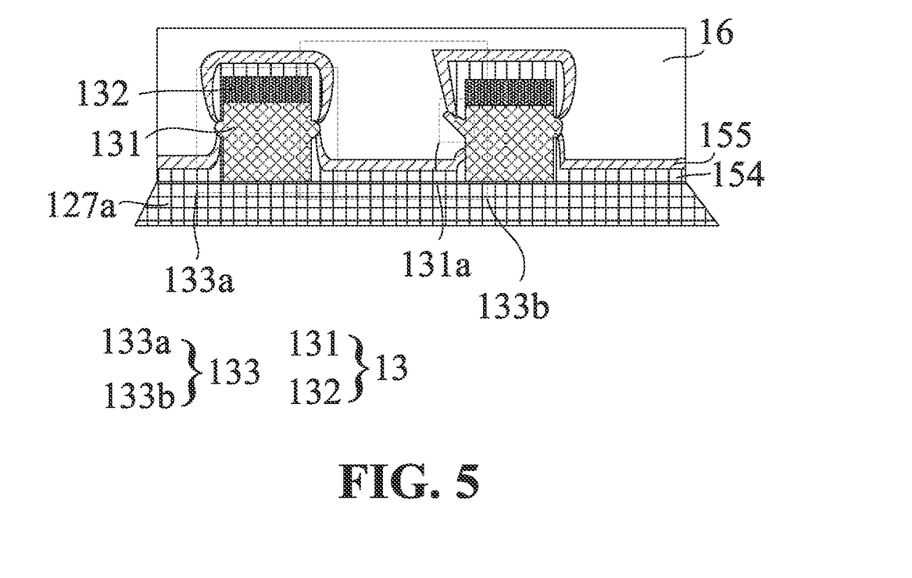
FIG. 5 is a sectional view taken along a line A1-A2 in FIG. 4.

There is still a problem that there are fewer places where the cathode layer is in contact with the first conductive layer after the conductive units are provided. In an embodiment, as shown in FIG. 4 and FIG. 5, each of the conductive units 133 comprises a conductive portion 133a and a via hole 133b. The conductive portion 133a is arranged around the via hole 133b. In each of the conductive units 133, the protrusions 131a are formed on a surface of the conductive portion 133a close to the via hole 133b. By making each of the conductive units comprise one conductive portion and one via hole, and arranging the conductive portion arranged around the via hole, the surface of the conductive portion close to the via hole can form protrusions. Furthermore, a side surface of each of the conductive units can form protrusions, that is, a surface of the conductive portion away from the via hole can form protrusions. That is, both an outer side and an inner side of the conductive portion can form protrusions, which increases the number of the places where the cathode layer is in contact with the first conductive layer, thereby improving the conduction between the cathode layer and the conductive layer, and improving the conduction between the cathode layer and the terminal.

Specifically, FIG. 4 is a perspective view of the OLED display panel.

FIG. 4 only shows the terminal 127a and the conductive layer, therefore, in the perspective view, the terminal 127a can be seen in the via hole of the conductive layer. As shown in FIG. 4, in an overlapping hole 31, each of the conductive units 133 is formed into one conductive portion 133a and one via hole 133b. FIG. 5 is a sectional view taken along a line A1-A2 in FIG. 4. FIG. 5 shows the terminal 127a, the conductive layer 13, the electron transport layer 154, the electron injection layer 155, and the cathode layer 16. As shown in FIG. 5, the surface of the conductive portion 133a close to the via hole 133b forms the protrusions 131a, and the surface of the conductive portion 133a away from the via hole 133b forms the protrusions 131a, which increases the number of the places where the cathode layer 16 is in contact with the first conductive layer 131, thereby improving the conduction between the cathode layer 16 and the conductive layer 13, and improving the conduction between the cathode layer 16 and the terminal 127a.

Figure 6:
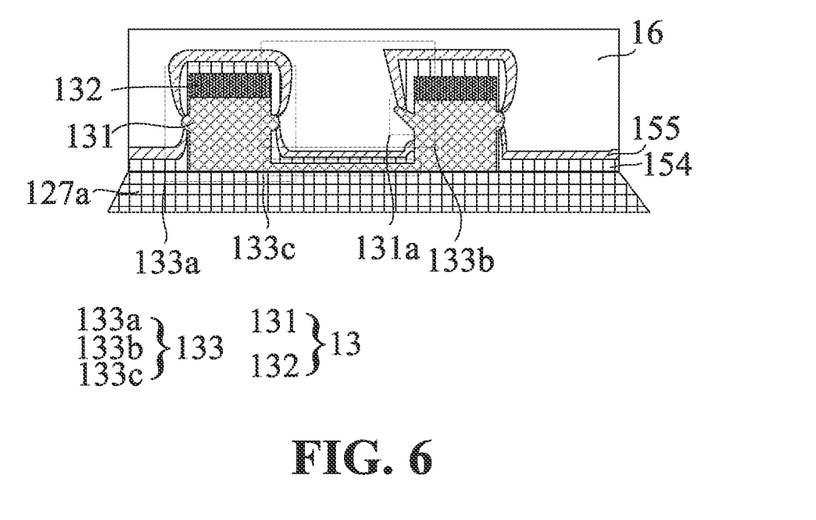
FIG. 6 is a fifth schematic diagram of an OLED display panel according to an embodiment of the present disclosure.

In an embodiment, as shown in FIG. 6, each of the conductive units 133 further comprises a connection portion 133c corresponding to the via hole 133b and connected to the conductive portion 133a. When forming the conductive units, one via hole is formed in each of the conductive units, but the via hole is controlled not to penetrate the conductive unit, so that the conductive portion is connected with the connection portion, which makes a contact between the conductive units and the terminal better, and improves a conduction between the conductive units and the terminal.

In an embodiment, the terminal is made of metal.

In an embodiment, a cross-sectional shape of the via hole comprises one or more of a circle, a square, a diamond, and a strip.

Figure 7:
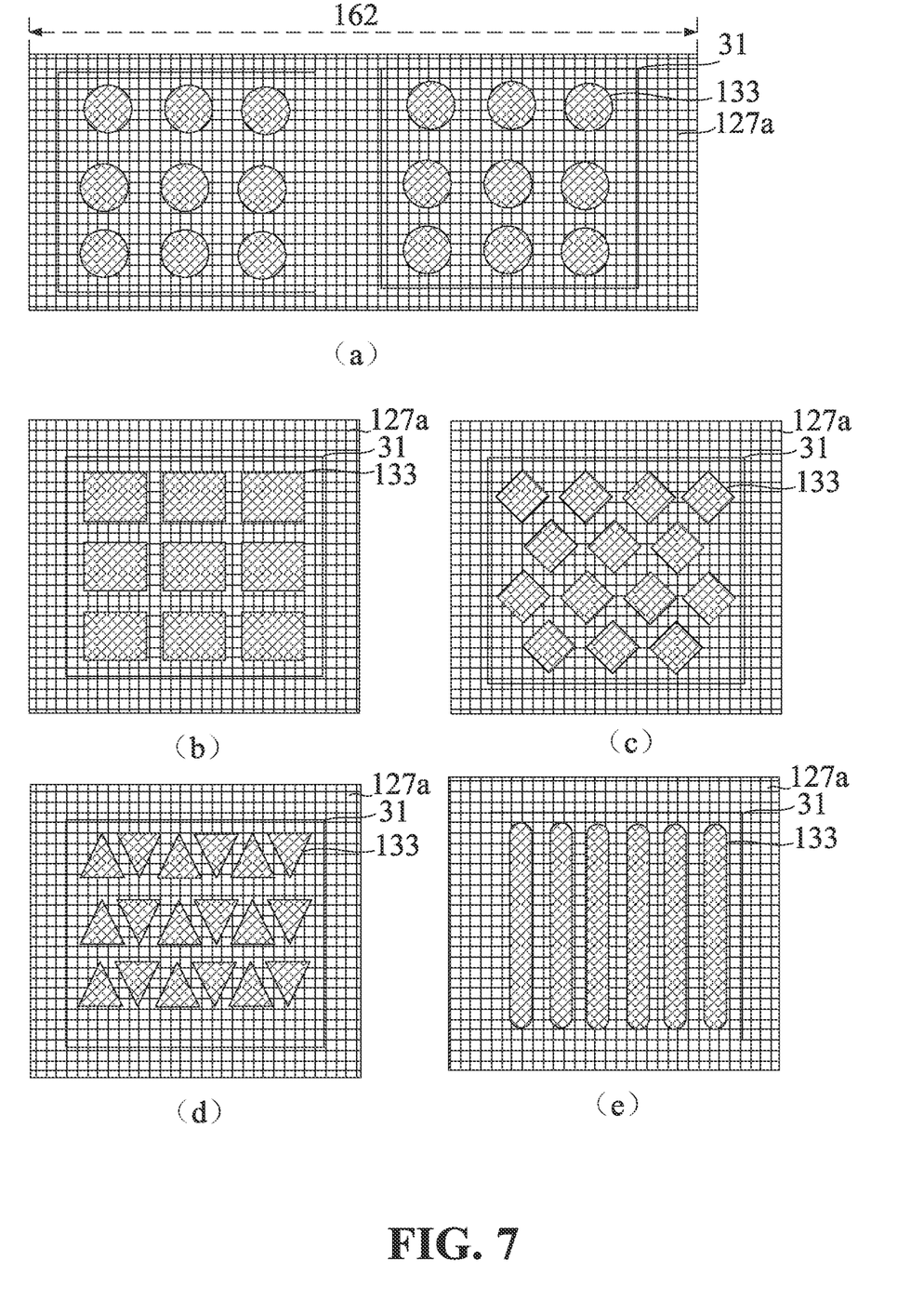
FIG. 7 is a sixth schematic diagram of an OLED display panel according to an embodiment of the present disclosure.

In an embodiment, as shown in FIG. 7, a cross-sectional shape of the conductive unit 133 comprises one or more of a circle, a square, a diamond, and a strip.

Specifically, (a) in FIG. 7 shows conductive units with a circular cross-sectional shape, (b) in FIG. 7 shows conductive units with a square cross-sectional shape, (c) in FIG. 7 shows conductive units with a diamond-shaped cross-sectional shape, (d) in FIG. 7 shows conductive units with a triangular cross-sectional shape, and (e) in FIG. 7 shows conductive units with a s strip-like cross-sectional shape, but the present disclosure is not limited thereto. For example, the cross-sectional shape of the conductive unit may comprise a strip shape and a circle shape.

Figure 8:
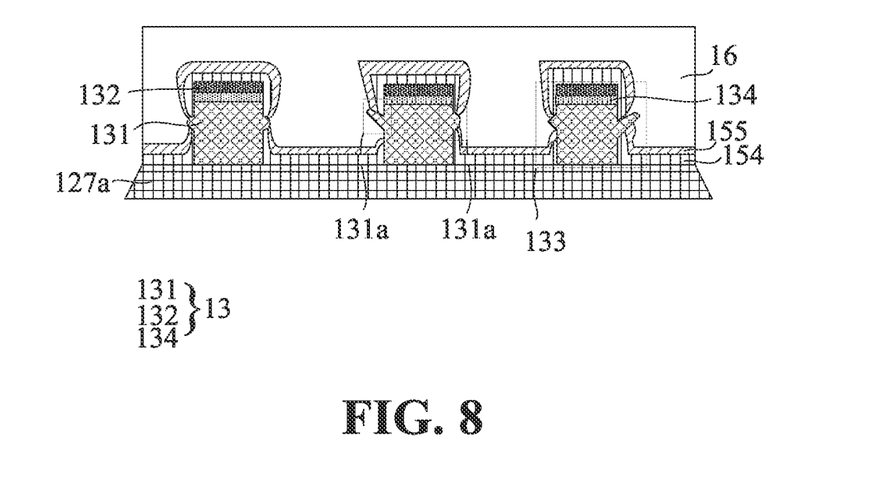
FIG. 8 is a seventh schematic diagram of an OLED display panel according to an embodiment of the present disclosure.

In an embodiment, as shown in FIG. 1 and FIG. 8, the conductive layer 13 further comprises a third conductive layer 134. The third conductive layer 134 is disposed between the first conductive layer 131 and the terminal 127a. A conductivity of the third conductive layer 134 is greater than a conductivity of the first conductive layer 131, a metal mobility of the third conductive layer 134 is less than a metal mobility of the first conductive layer 131, and an oxidation rate of the third conductive layer 134 is less than an oxidation rate of the first conductive layer 131. By disposing a third conductive layer between the first conductive layer and the terminal, making the conductivity of the third conductive layer greater than the conductivity of the first conductive layer, making the metal mobility of the third conductive layer less the metal mobility that of the first conductive layer, and making the oxidation rate of the third conductive layer less than the oxidation rate of the first conductive layer, the conductivity of the conductive layer is improved, and the conduction between the cathode layer and the terminal is improved.

Specifically, the above embodiment is described by taking the third conductive layer disposed between the terminal and the first conductive layer as an example, but the present disclosure is not limited thereto. For example, the third conductive layer is disposed between the second conductive layer and the cathode layer, which is not described in detail herein.

In an embodiment, as shown in FIG. 1, the driving circuit layer 12 further comprises a light shielding layer 121, a buffer layer 122, an active layer 123, a gate insulating layer 124, a gate electrode layer 125, an interlayer insulating layer 126, a source and drain electrode layer 127, a passivation layer 128, and a planarization layer 129.

Specifically, as shown in FIG. 1, the source and drain electrode layer 127 forms the terminal 127a as an example for description, but the present disclosure is not limited thereto. For example, the terminal may be formed from one of the other metal layers, or formed by adding a metal layer, which is not described in detail herein.

In an embodiment, as shown in FIG. 1, the light-emitting functional layer 15 further comprises a hole injection layer 151, a hole transport layer 152, and a light-emitting material layer 153.

In an embodiment, as shown in FIG. 1, the OLED display panel 1 further comprises an encapsulation layer 17.

Furthermore, the present disclosure further provides a method for fabricating an OLED display panel. The OLED display panel described in any one of the above embodiments is prepared by the method for fabricating the OLED display panel. The method for fabricating the OLED display panel comprises:

provide a substrate;

forming a driving circuit layer on the substrate, wherein the driving circuit layer comprises a terminal;

forming a pixel definition layer and a pixel electrode layer on the driving circuit layer;

etching the pixel definition layer to form a via hole in an overlapping area;

forming a hole injection layer, a hole transport layer, and a light-emitting material layer in sequence on the pixel electrode layer by inkjet printing;

forming a conductive layer within the via hole in the overlapping area, wherein the conductive layer comprises a first conductive layer and a second conductive layer, the first conductive layer is disposed between the terminal and the second conductive layer and comprises a plurality of protrusions, a metal mobility of the first conductive layer is greater than a metal mobility of the second conductive layer, and an oxidation rate of the first conductive layer is greater than an oxidation rate of the second conductive layer;

forming an electron transport layer and an electron injection layer in sequence on the light-emitting material layer with one mask, wherein the electron transport layer and the electron injection layer are disconnected at the protrusions; and forming a cathode layer on the electron transport layer and the electron injection layer with the same mask, wherein the cathode layer is in contact with the protrusions, thereby obtaining the OLED display panel.

Figure 9:
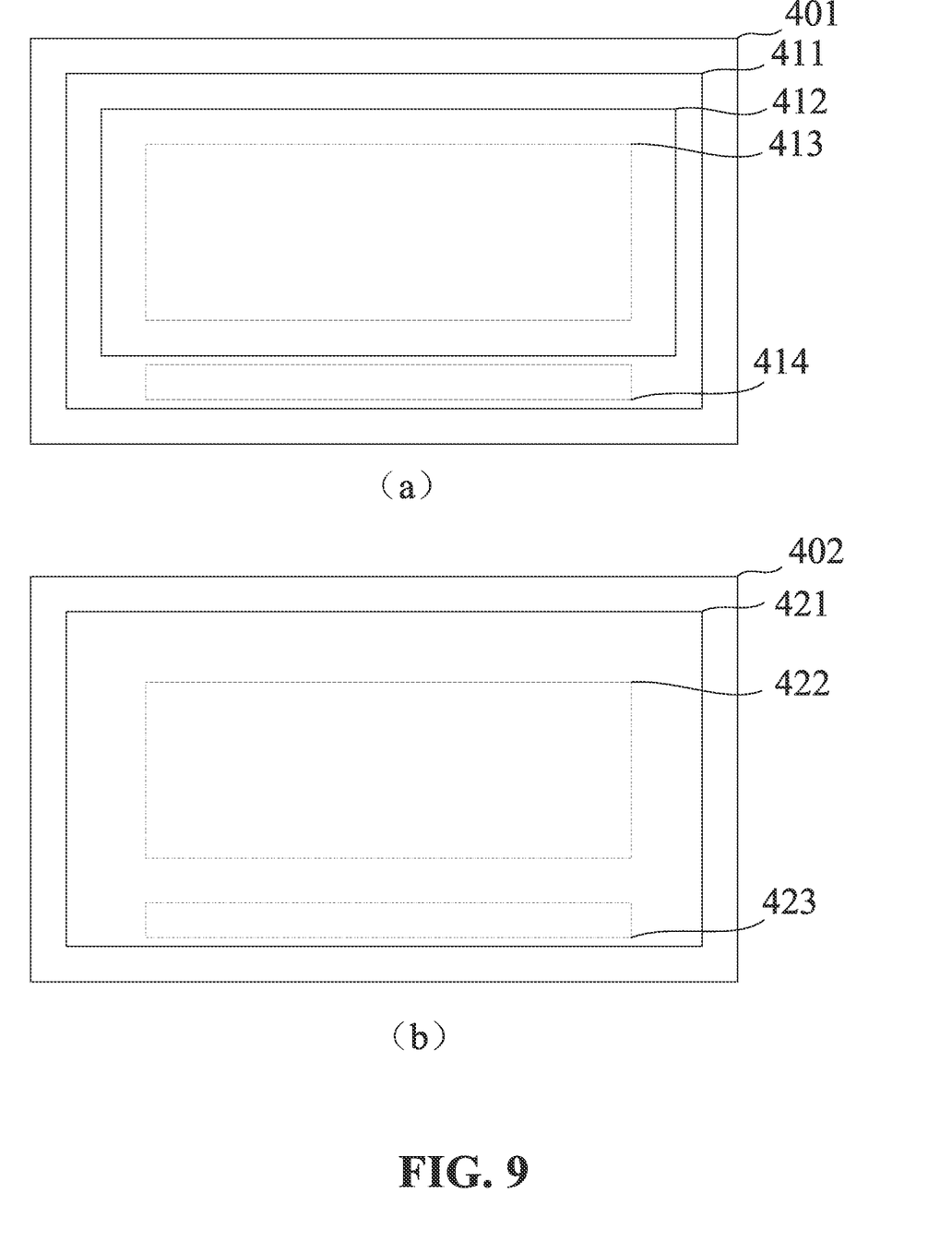
FIG. 9 is a comparison diagram of a current OLED display panel and an OLED display panel according to an embodiment of the present disclosure.

Please refer to FIG. 9, (a) in FIG. 9 shows a design of areas of layers of a current OLED display panel. It can be seen from (a) in FIG. 9 that within a boundary 401 of the OLED display panel, because an electron transport layer and an electron injection layer cannot conduct a cathode layer and a terminal, an area of the electron transport layer and the electron injection layer need to be less than an area of the cathode layer. That is, a boundary 412 of the electron transport layer and the electron injection layer is located within a boundary 411 of the cathode layer. Therefore, a boundary of a first mask for forming the electron transport layer and the electron injection layer is different from a boundary of a second mask for forming the cathode layer, so that the electron transport layer and the electron injection layer are close to a boundary 413 of a display area, but do not cover an overlapping area 414. Therefore, the current OLED display panel requires different masks to form the cathode layer, the electron transport layer, and the electron injection layer.

As shown in (b) of FIG. 9, in the present disclosure, the electron transport layer, the electron injection layer, and the cathode layer are formed within a boundary 402 of the OLED display panel by using one mask. A boundary 422 of the display area and a boundary 423 of the overlapping area are not changed, and the mask has only one boundary. A boundary of the electron transport layer and a boundary of the electron injection layer basically coincide, or even coincide, with a boundary 421 of the cathode layer. Furthermore, the cathode layer and the terminal are conducted through the conductive layer in the above embodiments. The electron transport layer, the electron injection layer, and the cathode layer are formed with the same mask, which improves the production efficiency of the OLED display panel and reduces the cost. Furthermore, because no spacing is required between the boundaries of the electron transport layer, the electron injection layer, and the cathode layer, a border can be reduced to realize a narrow border of the OLED display panel.

In addition, the present disclosure further provides an OLED display device, which comprises a driving chip and the OLED display panel according to any one of the above embodiments.

In view of the above embodiments, the present disclosure provides an OLED display panel comprising a display area and an overlapping area, and further comprising a substrate, a driving circuit layer, a light-emitting functional layer, a cathode layer, and a conductive layer. The driving circuit layer is disposed on a side of the substrate and comprises a terminal. The light-emitting functional layer is disposed on a side of the driving circuit layer away from the substrate, and comprises an electron transport layer and an electron injection layer. The electron transport layer is disposed between the driving circuit layer and the electron injection layer. The cathode layer is disposed on a side of the electron injection layer away from the electron transport layer. The conductive layer is disposed in the overlapping area, and comprises a first conductive layer and a second conductive layer. The first conductive layer is disposed between the terminal and the second conductive layer and comprises a plurality of protrusions. The second conductive layer is disposed between the first conductive layer and the electron transport layer. The electron injection layer is disposed between the electron transport layer and the cathode layer. Each of the electron transport layer and the electron injection layer is disconnected at the protrusions, and the cathode layer is in contact with the protrusions. In the present disclosure, the first conductive layer and the second conductive layer are disposed in the overlapping area, the first conductive layer is disposed between the terminal and the second conductive layer, the second conductive layer is disposed between the first conductive layer and the electron transport layer, and the electron injection layer is disposed between the electron transport layer and the cathode layer, so that the electron injection layer, the electron transport layer, and the cathode layer can be formed with one mask, so as to improve production efficiency of the OLED display panel. Furthermore, the first conductive layer is provided with the protrusions, so that each of the electron transport layer and the electron injection layer is disconnected at the protrusions, and the cathode layer is in contact with the protrusions. Therefore, the cathode layer is connected to the terminal only by the conductive layer, so as to improve conduction between the cathode layer and the terminal, so that the OLED display panel can work normally.

In the above embodiments, the description of each embodiment has its own emphasis. For parts not detailed in one embodiment, reference may be made to the related descriptions in other embodiments.

The display substrates provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. An OLED display panel, comprising a display area and an overlapping area, and further comprising:
    a substrate;
    a driving circuit layer disposed on a side of the substrate and comprising a terminal;
    a light-emitting functional layer disposed on a side of the driving circuit layer away from the substrate, and comprising an electron transport layer and an electron injection layer, wherein the electron transport layer is disposed between the driving circuit layer and the electron injection layer;
    a cathode layer disposed on a side of the electron injection layer away from the electron transport layer; and
    a conductive layer disposed in the overlapping area and comprising a first conductive layer and a second conductive layer, wherein the first conductive layer is disposed between the terminal and the second conductive layer and comprises a plurality of protrusions, the second conductive layer is disposed between the first conductive layer and the electron transport layer, the electron injection layer is disposed between the electron transport layer and the cathode layer, Each of the electron transport layer and the electron injection layer is disconnected at the protrusions, and the cathode layer is in contact with the protrusions.

2. The OLED display panel according to claim 1, wherein a metal mobility of the first conductive layer is greater than a metal mobility of the second conductive layer, and an oxidation rate of the first conductive layer is greater than an oxidation rate of the second conductive layer.

3. The OLED display panel according to claim 2, wherein the first conductive layer is made of a first metal material, a metal mobility of the first metal material is greater than the metal mobility of the second conductive layer, and an oxidation rate of the first metal material is greater than the oxidation rate of the second conductive layer.

4. The OLED display panel according to claim 3, wherein the second conductive layer is made of a second metal material or metal oxide.

5. The OLED display panel according to claim 3, wherein the protrusions comprise a first protrusion located on a side surface of the first conductive layer, the electron injection layer and the electron transport layer are located on a side of the first protrusion, and the cathode layer is in contact with at least a top of the first protrusion.

6. The OLED display panel according to claim 5, wherein a projection of a surface of the second conductive layer in contact with the first conductive layer on the substrate coincides with a projection of a surface of the first conductive layer in contact with the second conductive layer on the substrate.

7. The OLED display panel according to claim 5, wherein a projection of a surface of the second conductive layer in contact with the first conductive layer on the substrate is less than a projection of a surface of the first conductive layer in contact with the second conductive layer on the substrate.

8. The OLED display panel according to claim 7, wherein the protrusions further comprise a second protrusion located on a region of the surface of the first conductive layer outside the second conductive layer, the electron injection layer and the electron transport layer are located on a side of the second protrusion, and the cathode layer is in contact with at least a top of the second protrusion.

9. The OLED display panel according to claim 1, further comprising a pixel electrode layer, wherein the pixel electrode layer comprises a pixel electrode located in the display area, and the first conductive layer and the second conductive layer located in the overlapping area.

10. The OLED display panel according to claim 1, wherein the conductive layer comprises two or more conductive units, the conductive units are arranged at intervals, and the protrusions on each of the conductive units are spaced apart from adjacent conductive units.

11. The OLED display panel according to claim 10, wherein each of the conductive units comprises a conductive portion and a via hole, the conductive portion is arranged around the via hole, and in each of the conductive units, the protrusions are formed on a surface of the conductive portion close to the via hole.

12. The OLED display panel according to claim 11, wherein each of the conductive units further comprises a connection portion corresponding to the via hole and connected to the conductive portion.

13. The OLED display panel according to claim 1, wherein the conductive layer further comprises a third conductive layer disposed between the first conductive layer and the terminal, a conductivity of the third conductive layer is greater than a conductivity of the first conductive layer, a metal mobility of the third conductive layer is less than a metal mobility of the first conductive layer, and an oxidation rate of the third conductive layer is less than an oxidation rate of the first conductive layer.

* * * * *